United States Patent
Guo et al.

(10) Patent No.: US 10,522,549 B2
(45) Date of Patent: Dec. 31, 2019

(54) UNIFORM GATE DIELECTRIC FOR DRAM DEVICE

(71) Applicant: Varian Semiconductor Equipment Associates, Inc., Gloucester, MA (US)

(72) Inventors: Baonian Guo, Andover, MA (US); Qintao Zhang, Gloucester, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 68 days.

(21) Appl. No.: 15/898,501

(22) Filed: Feb. 17, 2018

(65) Prior Publication Data
US 2019/0259764 A1    Aug. 22, 2019

(51) Int. Cl.
*H01L 21/8242*    (2006.01)
*H01L 21/02*    (2006.01)
(Continued)

(52) U.S. Cl.
CPC .... *H01L 27/10876* (2013.01); *H01L 21/0223* (2013.01); *H01L 21/02227* (2013.01);
(Continued)

(58) Field of Classification Search
CPC ........... H01L 25/03–04; H01L 25/0655; H01L 25/072; H01L 25/50; H01L 29/02; H01L 29/36; H01L 29/365; H01L 29/66007; H01L 29/7788; H01L 29/7831; H01L 29/7858; H01L 29/788–7926; H01L 29/8124; H01L 21/02107–02112; H01L 21/02126; H01L 21/0223; H01L 21/02233; H01L 21/02252; H01L 21/02255; H01L 21/02299; H01L 21/02356; H01L 21/02359; H01L 21/02472; H01L 21/02554; H01L 21/0274; H01L 21/0279; H01L 21/2252; H01L 21/2253; H01L 21/2255; H01L 21/2256; H01L 21/26513; H01L 21/26546; H01L 21/26553; H01L 21/26586; H01L 21/30604; H01L 21/3065; H01L 21/308; H01L 21/31;
(Continued)

(56) References Cited

U.S. PATENT DOCUMENTS

| | | | | |
|---|---|---|---|---|
| 3,901,737 A | * | 8/1975 | Dash ....................... | H01L 21/00 438/421 |
| 4,569,701 A | * | 2/1986 | Oh ....................... | H01L 21/2257 148/DIG. 35 |

(Continued)

*Primary Examiner* — Maliheh Malek

(57) ABSTRACT

Provided herein are approaches for forming a gate dielectric layer for a DRAM device, the method including providing a substrate having a recess formed therein, the recess including a sidewall surface and a bottom surface. The method may further include performing an ion implant into just the bottom surface of the recess, and forming a gate dielectric layer along the bottom surface of the recess and along the sidewall surface of the recess. Once formed, a thickness of the gate dielectric layer along the sidewall surface is approximately the same as a thickness of the gate dielectric layer along the bottom surface of the recess. In some embodiments, the gate dielectric layer is thermally grown within the recess. In some embodiments, the ion implant is performed after a mask layer atop the substrate is removed.

20 Claims, 5 Drawing Sheets

(51) Int. Cl.
*H01L 27/108* (2006.01)
*H01L 21/265* (2006.01)
*H01L 21/28* (2006.01)
*H01L 25/03* (2006.01)
*H01L 21/027* (2006.01)
*H01L 21/461* (2006.01)

(52) U.S. Cl.
CPC .. *H01L 21/02299* (2013.01); *H01L 21/26586* (2013.01); *H01L 21/2822* (2013.01)

(58) Field of Classification Search
CPC ........... H01L 21/2822; H01L 21/02225; H01L 21/02227; H01L 27/02; H01L 27/08; H01L 27/088; H01L 27/0886; H01L 27/1052; H01L 27/108; H01L 27/10823; H01L 27/10826; H01L 27/10844; H01L 27/10876; H01L 27/10879
See application file for complete search history.

(56) References Cited

U.S. PATENT DOCUMENTS

| | | | | |
|---|---|---|---|---|
| 4,666,556 A * | 5/1987 | Fulton | H01L 21/743 | 148/DIG. 50 |
| 4,756,793 A * | 7/1988 | Peek | H01L 21/0337 | 257/E21.038 |
| 4,931,409 A * | 6/1990 | Nakajima | H01L 21/763 | 257/519 |
| 5,026,659 A * | 6/1991 | Lee | H01L 27/10835 | 257/E21.008 |
| 5,183,775 A * | 2/1993 | Levy | H01L 21/02238 | 438/386 |
| 5,236,863 A * | 8/1993 | Iranmanesh | H01L 21/76294 | 148/DIG. 50 |
| 5,364,810 A * | 11/1994 | Kosa | H01L 21/26586 | 257/E21.345 |
| 5,445,989 A * | 8/1995 | Lur | H01L 21/316 | 438/425 |
| 5,637,533 A * | 6/1997 | Choi | H01L 21/28568 | 438/643 |
| 5,783,476 A * | 7/1998 | Arnold | H01L 21/76232 | 257/E21.549 |
| 5,811,347 A * | 9/1998 | Gardner | H01L 21/3144 | 438/435 |
| 5,920,786 A * | 7/1999 | Pham | G03F 7/0035 | 257/E21.218 |
| 5,945,352 A * | 8/1999 | Chen | H01L 21/3085 | 148/DIG. 50 |
| 5,998,261 A * | 12/1999 | Hofmann | H01L 27/11517 | 438/257 |
| 6,022,779 A * | 2/2000 | Shin | H01L 27/11273 | 438/275 |
| 6,069,057 A * | 5/2000 | Wu | H01L 21/76237 | 148/DIG. 50 |
| 6,071,794 A * | 6/2000 | Lin | H01L 21/28194 | 257/E21.546 |
| 6,235,610 B1 * | 5/2001 | Nicotra | H01L 21/266 | 257/E21.346 |
| 6,258,695 B1 * | 7/2001 | Dunn | H01L 21/76213 | 257/E21.551 |
| 6,348,388 B1 * | 2/2002 | Faltermeier | H01L 21/26506 | 438/303 |
| 6,414,364 B2 * | 7/2002 | Lane | H01L 21/76224 | 257/397 |
| 6,472,301 B1 * | 10/2002 | Lin | H01L 21/76237 | 257/E21.551 |
| 6,509,233 B2 * | 1/2003 | Chang | H01L 21/28167 | 438/270 |
| 6,544,894 B1 * | 4/2003 | Kobayashi | C23F 4/00 | 216/12 |
| 6,551,900 B1 * | 4/2003 | Chung | H01L 21/28185 | 438/424 |
| 6,855,994 B1 * | 2/2005 | King | C23C 14/48 | 257/296 |
| 9,412,733 B2 * | 8/2016 | Calafut | H01L 27/0629 | |
| 9,520,284 B1 * | 12/2016 | Chen | H01L 21/0228 | |
| 2002/0197782 A1 * | 12/2002 | Kitamura | H01L 29/0653 | 438/200 |
| 2003/0170964 A1 * | 9/2003 | Kao | H01L 21/76202 | 438/433 |
| 2003/0235959 A1 * | 12/2003 | Lichtenberger | H01L 29/0878 | 438/272 |
| 2004/0063281 A1 * | 4/2004 | Kwak | H01L 21/76229 | 438/257 |
| 2004/0157404 A1 * | 8/2004 | Park | H01L 21/76235 | 438/434 |
| 2005/0012173 A1 * | 1/2005 | Sheu | H01L 21/76237 | 257/519 |
| 2005/0020040 A1 * | 1/2005 | Yamaji | H01L 29/0653 | 438/534 |
| 2005/0048715 A1 * | 3/2005 | Rupp | H01L 27/10864 | 438/244 |
| 2005/0118784 A1 * | 6/2005 | Kim | H01L 21/76229 | 438/424 |
| 2005/0127465 A1 * | 6/2005 | Chiola | H01L 27/0814 | 257/471 |
| 2005/0142775 A1 * | 6/2005 | Koh | H01L 21/76235 | 438/296 |
| 2005/0173744 A1 * | 8/2005 | Kim | H01L 21/823437 | 257/296 |
| 2005/0275069 A1 * | 12/2005 | Haddad | H01L 21/76237 | 257/629 |
| 2006/0105541 A1 * | 5/2006 | Inoue | H01L 21/76235 | 438/452 |
| 2006/0134882 A1 * | 6/2006 | Zhang | H01L 21/76235 | 438/424 |
| 2006/0208314 A1 * | 9/2006 | Kaneko | H01L 21/26533 | 257/330 |
| 2007/0132015 A1 * | 6/2007 | Kujirai | H01L 29/66621 | 257/330 |
| 2008/0042194 A1 * | 2/2008 | Hshieh | H01L 21/28035 | 257/331 |
| 2008/0293213 A1 * | 11/2008 | Yang | H01L 21/76235 | 438/433 |
| 2010/0038711 A1 * | 2/2010 | Hsieh | H01L 29/0619 | 257/331 |
| 2010/0055856 A1 * | 3/2010 | Hong | H01L 21/31155 | 438/239 |
| 2010/0151642 A1 * | 6/2010 | Yeh | H01L 21/26506 | 438/270 |
| 2011/0175162 A1 * | 7/2011 | Kim | H01L 27/10802 | 257/330 |
| 2011/0175171 A1 * | 7/2011 | Nam | H01L 21/26506 | 257/369 |
| 2012/0025874 A1 * | 2/2012 | Saikaku | H01L 29/1095 | 327/109 |
| 2012/0132971 A1 * | 5/2012 | Mikasa | H01L 27/10814 | 257/296 |
| 2012/0252226 A1 * | 10/2012 | Kabe | C23C 8/36 | 438/772 |
| 2013/0109165 A1 * | 5/2013 | Cho | H01L 29/66666 | 438/589 |
| 2013/0200451 A1 * | 8/2013 | Yilmaz | H01L 29/4236 | 257/331 |
| 2014/0038382 A1 * | 2/2014 | Basker | H01L 21/0243 | 438/390 |
| 2015/0035051 A1 * | 2/2015 | Hebert | H01L 29/7813 | 257/334 |
| 2015/0072508 A1 * | 3/2015 | Or | H01L 21/326 | 438/466 |
| 2015/0115397 A1 * | 4/2015 | Cheng | H01L 29/0649 | 257/510 |
| 2015/0214061 A1 * | 7/2015 | Zhou | H01L 29/42368 | 257/330 |
| 2015/0221734 A1 * | 8/2015 | Lee | H01L 29/407 | 257/330 |
| 2015/0236119 A1 * | 8/2015 | Tanaka | H01L 29/66068 | 257/77 |

(56) References Cited

U.S. PATENT DOCUMENTS

| | | | |
|---|---|---|---|
| 2016/0181358 A1* | 6/2016 | Zhang | H01L 29/66689 |
| | | | 257/339 |
| 2017/0004994 A1* | 1/2017 | Lin | H01L 21/3215 |
| 2017/0069726 A1* | 3/2017 | Kye | H01L 29/401 |
| 2017/0069727 A1* | 3/2017 | Blanchard | H01L 29/7813 |
| 2017/0179133 A1* | 6/2017 | Ruffell | H01L 29/66803 |
| 2017/0271199 A1* | 9/2017 | Kalnitsky | H01L 21/823481 |
| 2018/0096849 A1* | 4/2018 | Burke | H01L 29/417 |
| 2018/0204906 A1* | 7/2018 | Okada | H01L 29/0623 |
| 2019/0081147 A1* | 3/2019 | West | H01L 29/42368 |

* cited by examiner

UNIFORM GATE DIELECTRIC FOR DRAM DEVICE

FIELD OF THE DISCLOSURE

The present embodiments relate to substrate patterning, and more particularly, to techniques for implanting a substrate with ions to form a gate oxide having a uniform thickness.

BACKGROUND OF THE DISCLOSURE

In dynamic random-access memory (DRAM) device/flash memory fabrication, implanting a semiconductor dopant species into the polycrystalline silicon (polysilicon) gate electrodes beneficially increases conductivity. The gate electrodes may be formed by depositing amorphous silicon on a thin gate oxide layer and then annealing the wafer to transform the deposited silicon from the amorphous state to a polycrystalline state. The polycrystalline silicon gate layer thus formed may be approximately 50 nm to 80 nm thick. The implanted species is one promoting p-type conductivity in silicon, such as boron, or n-type conductivity, such as arsenic, phosphorous or antimony. The gate electrode can also be made by certain metals such as TiN or W.

Write/read speed and retention time are key factors of a DRAM. Better performance, such as high drive-current and low off-current of cell transistors, is key to improving the key factors. Thinner gate oxide can effectively improve performance. As such, the layer thickness of the gate oxide continues to be reduced. DRAM scaling has negatively led to increased non-uniformity in gate oxide thickness of cell transistors. In some cases, a bottom gate oxide within an opening or channel can be as much as 3 nm thinner than the gate oxide formed on the sidewalls of the opening or channel. A thinner bottom gate oxide brings significantly reliability risk for cell transistors.

SUMMARY OF THE DISCLOSURE

In view of the foregoing, what is needed are methods for improving write/read speed and retention time in DRAM access devices by providing a uniform gate oxide within a buried channel. In one approach, a method for forming a dynamic random-access memory device (DRAM) device may include providing a substrate having a recess formed therein, the recess including a sidewall surface and a bottom surface. The method may further include performing an ion implant into just the bottom surface of the recess. The method may further include forming a gate dielectric layer along the bottom surface of the recess and along the sidewall surface of the recess. A thickness of the gate dielectric layer along the sidewall surface of the recess is approximately the same as a thickness of the gate dielectric layer along the bottom surface of the recess.

A method for of forming a buried word line transistor of a dynamic random-access memory device (DRAM) device may include forming a plurality of buried channels in a substrate, each of the plurality of buried channels including a sidewall surface and a bottom surface. The method may further include performing an ion implant into just the bottom surface of each of the plurality of buried channels. The method may further include forming a gate dielectric layer along the bottom surface and along the sidewall surface of each of the plurality of buried channels after the ion implant is performed. A thickness of the gate dielectric layer along the sidewall surface of each of the plurality of buried channels is approximately the same as a thickness of the gate dielectric layer along the bottom surface of each of the plurality of buried channels.

A method for a uniform gate oxide layer of a dynamic random-access memory device (DRAM) device may include etching a plurality of buried channels in a substrate, each of the plurality of buried channels including a sidewall surface and a bottom surface. The method may further include performing an ion implant into just the bottom surface of each of the plurality of buried channels. The method may further include forming a gate oxide layer along the bottom surface and along the sidewall surface of each of the plurality of buried channels after the ion implant is performed. A thickness of the gate oxide layer along the sidewall surface is approximately the same as a thickness of the gate oxide layer along the bottom surface of each of the plurality of buried channels.

Figure 1:
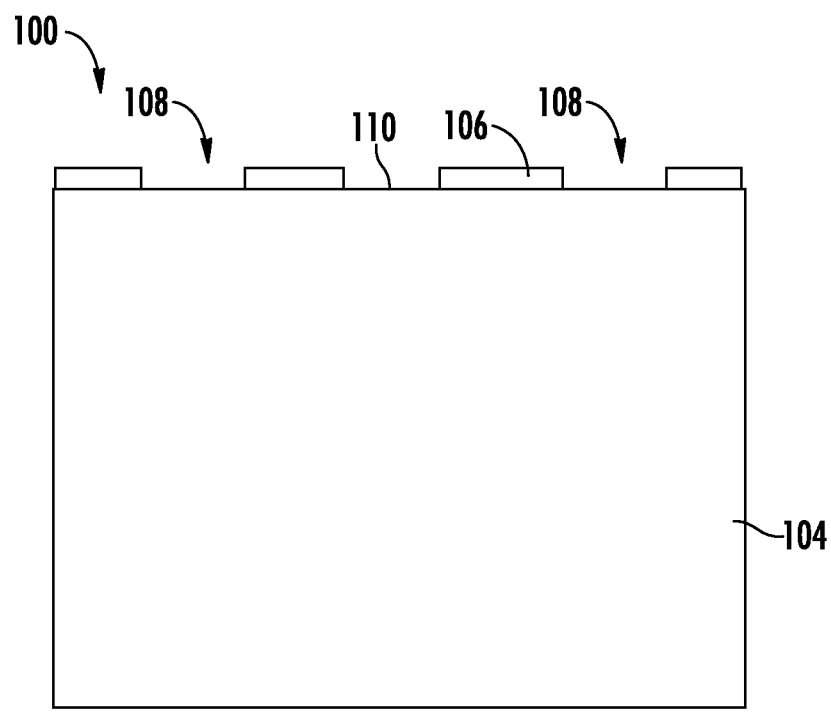
FIG. 1 depicts a side cross-sectional view of an approach for patterning a mask layer of a device in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, provided are approaches for forming a gate oxide layer for a semiconductor device (e.g., DRAM), the method including providing a substrate having a recess formed therein, the recess (e.g., a trench or buried channel) including a sidewall surface and a bottom surface. The method may further include performing an ion implant into just the bottom surface of the recess, and forming a gate dielectric layer along the bottom surface of the recess and along the sidewall surface of the recess. Once formed, a thickness of the gate dielectric layer along the sidewall surface is approximately the same as a thickness of the gate dielectric layer along the bottom surface of the recess. In some embodiments, the gate dielectric layer is thermally grown within the recess. In some embodiments, the ion implant is performed after a mask layer atop the substrate is removed.

Although not limited to any particular implementation, embodiments herein reduce time-dependent dielectric breakdown (TDDB) caused by non-uniform gate oxide of buried word line in beyond 1×DRAM nodes. Providing more dopant in the bottom of the trench, e.g., via the ion implant to just the bottom of the trench, enables a faster oxidation rate, and thus a more uniform gate oxide thickness between the bottom and sides of the trench.

Turning now to FIG. 1, there is shown a cross-sectional view of an approach for forming a device 100 (e.g., a DRAM device) according to embodiments of the disclosure. The device 100 comprises a substrate 104 (e.g., bulk silicon) and a mask layer 106 atop the substrate 104. As shown, the mask layer 106 may have a plurality of openings 108 formed therein. The openings 108 may be fabricated using any suitable process including one or more photolithography and etch processes.

In some embodiments, forming the mask layer 106 may include providing a photoresist layer over a top surface 110 of the substrate 104, exposing the photoresist to a pattern, performing post-exposure bake processes, and developing the resist to form the mask layer 106 including the resist. As demonstrated in FIG. 2, the mask layer 106 may then be used to etch a plurality of recesses, trenches, or buried channels 112 into the substrate 104, e.g., using reactive ion etch (RIE) and/or other suitable processes to the areas of the substrate 104 left exposed by the openings 108 of the mask layer 106. As shown, the buried channels 112 may be defined by one or more patterning features, such as one or more fins 120. Each of the buried channels 112 may include a bottom surface 122 and one or more sidewall surfaces 124. In some embodiments, the fins 120 may all have a uniform height across the substrate 104, as well as a uniform distance between adjacent fins. Embodiments herein are not limited to any particular structure or shape of patterning features.

In one non-limiting embodiment, the fins 120 are formed using a sidewall image transfer technique. In another embodiment, the fins 120 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, although not limited to, double exposure (e.g., using two mask sets), forming spacers adjacent features and removing the features to provide a pattern of spacers, resist freezing, and/or other suitable processes.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of semiconductor substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

Figure 2:
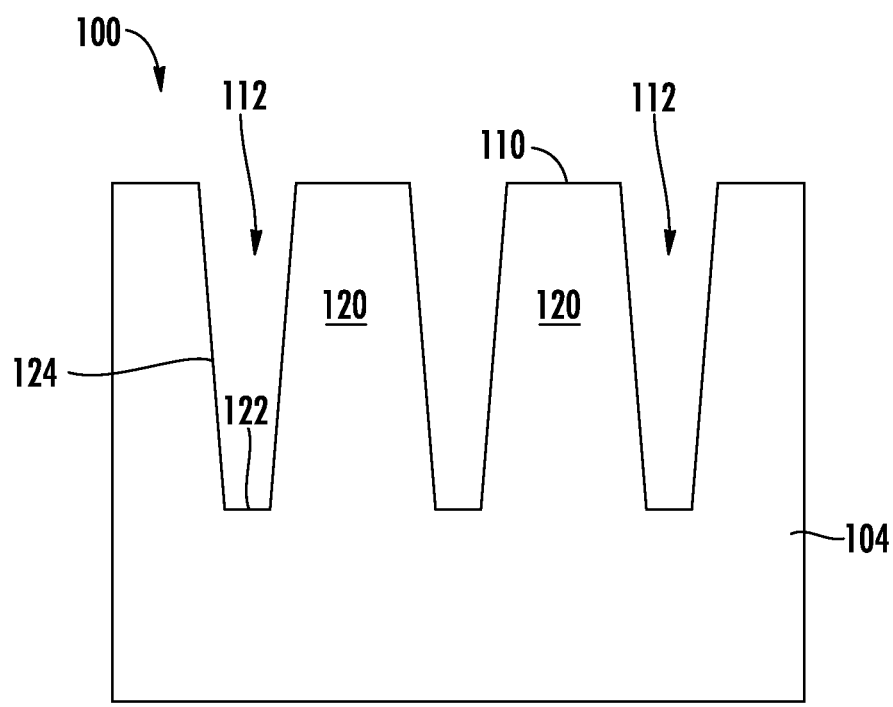
FIG. 2 depicts a side cross-sectional view of an approach for forming buried channels of the device of FIG. 1 in accordance with an embodiment of the present disclosure.
Figure 3:
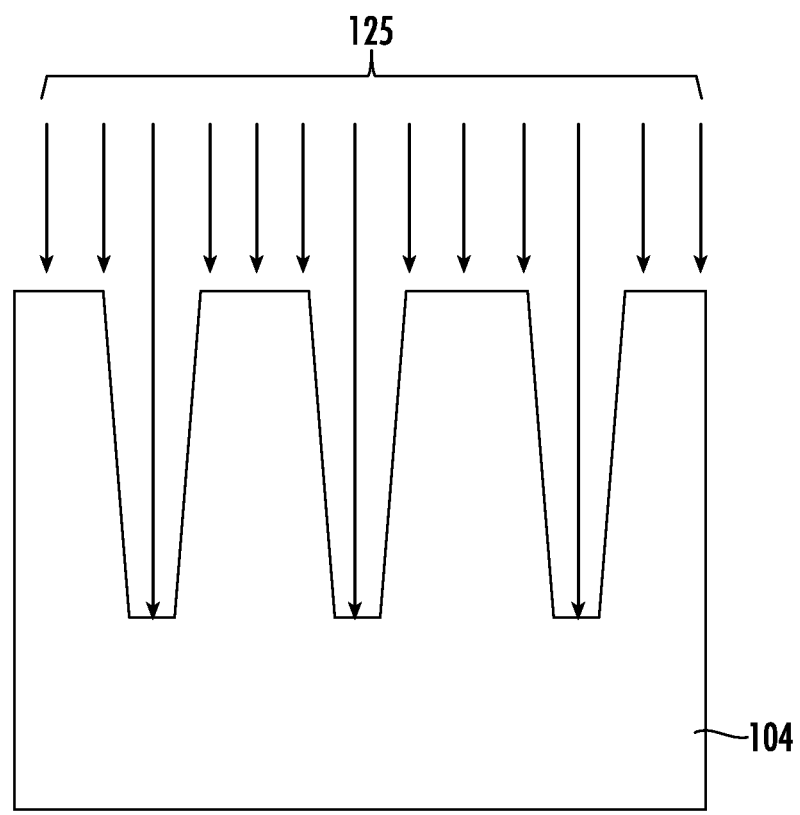
FIG. 3 depicts a side cross-sectional view of an approach for ion implanting the buried channels of the device of FIG. 2 in accordance with an embodiment of the present disclosure.

As further shown in FIG. 2, the mask layer 106 may then be removed following formation of the buried channels 112, yet prior to an ion implant demonstrated in FIG. 3. In other embodiments, an ion implant to the substrate 104 may be performed while the mask layer 106 is in place atop the top surface 110 of the substrate 104. As shown in FIG. 3, an ion implant 125 may be directed to the substrate, for example, at an angle approximately perpendicular to the top surface 110 of the substrate. In some embodiments, an ion species of the ion implant 125 may be at least one of: germanium, fluorine, and oxygen. The ion implant 125 may be a high current vertical implant oriented to impact just the bottom surface 122 of each of the buried channels 112. In other words, the angle of the ion implant 125 essentially prevents the ion implant 125 from impacting the sidewall surface(s) 124 of the buried channels 112.

Figure 4:
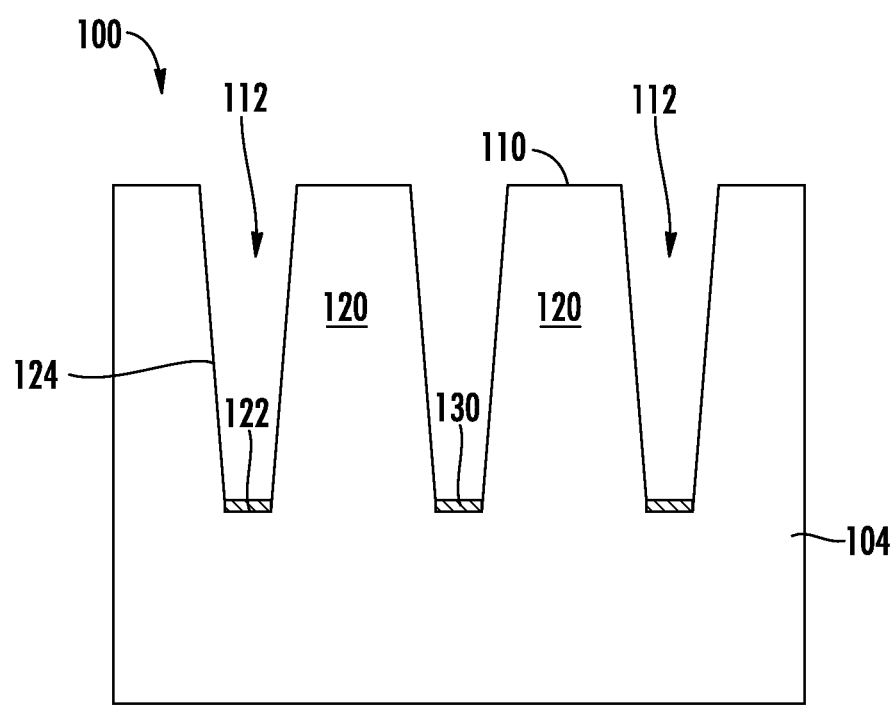
FIG. 4 depicts a side cross-sectional view of the device of FIG. 3 following the ion implant in accordance with an embodiment of the present disclosure.

In FIG. 4, the ion implant 125 to the bottom surface 122 of the buried channels 112 may form a doped layer or oxide layer 130 (e.g., $SiO_2$). In various embodiments, the ion implantation 125 may be performed before, or simultaneously with, a plasma exposure. For example, in the case of a Ge or F implantation for surface activation followed by $O_2$ plasma exposure, the wafer may cycle between an ion beam generator and an $O_2$ plasma source (not shown). In the case of simultaneous surface activation and plasma exposure, the growth process to form the oxide layer 130 is activated by a low energy (e.g., ~10-100 eV) Ge or F ion-bombardment of the bottom surface 122 whilst the surface is subjected to an O plasma. The Ge or F ion-irradiated implant reduces the activation energy of Si oxidation so oxidation readily occurs at a lower temperature. Meanwhile, the Ge or F beam of the ion implantation 125 can be directed just to certain parts of the buried channels 112, e.g., the bottom surface 122.

In some embodiments, the ion energy is low enough to eliminate damage to the crystalline Si of the substrate 104 and to maintain good structural integrity of the oxide. For example, a high quality stoichiometric Si-oxide with no end-of-range of damage to the underlying Si may be formed at 450° C. In one non-limiting embodiment, ion implantation may be provided by a beamline ion-implanter, a beamline implanter with modified end-station containing a remote O plasma source, or a modified beamline implanter delivering a beam of multiple 10s of eV energy. In other embodiments, to enable a faster growing and thicker oxide, crion may be added to the implant increase damage or breaking of bonds.

Figure 5:
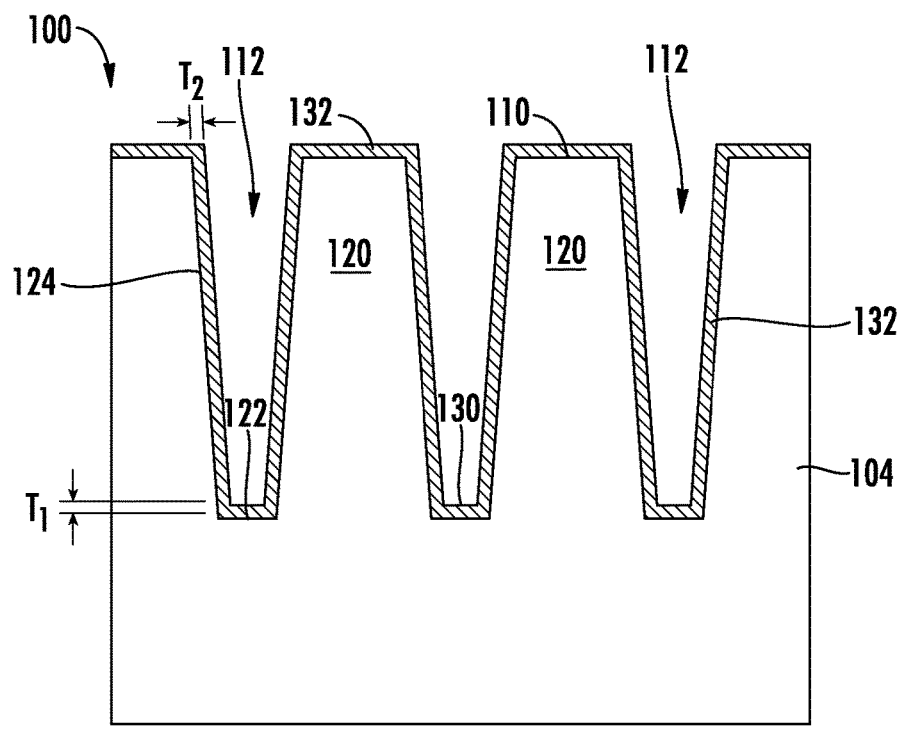
FIG. 5 depicts a side cross-sectional view of the device of FIG. 4 following formation of a gate dielectric layer within the buried channels in accordance with an embodiment of the present disclosure.

Referring now to FIG. 5, formation of a gate dielectric or gate oxide layer 132 within each buried channel 112 will be described in greater detail. In some embodiments, formation of the gate oxide layer 132 may include forming the gate oxide layer 132 along the sidewall surface 124 and the bottom surface 122 within each buried channel 112. In an exemplary embodiment, the gate oxide layer 132 is thermally grown over the substrate 104, including within each of the buried channels 112.

In various embodiments, the base oxide layer 132 may be conformally deposited within each buried channel 112, wherein "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD). Depositing may further include rapid thermal CVD (RTCVD), ultra-high vacuum CVD (UHVCVD), limited reaction processing CVD (LRPCVD), and metal-organic CVD (MOCVD). Depositing may further include sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As shown in FIG. 5, this results in the gate oxide layer 132 having a uniform thickness along both the sidewall surface 124 and the bottom surface 122 within each buried channel 112. For example, a thickness $T_1$ of the gate oxide layer 132 along the bottom surface 122 of the buried channels 112 is approximately the same as a thickness $T_2$ of the gate oxide layer 132 along the sidewall surfaces 124 of the buried channels 112. Increasing the ion implantation energy and/or ion dose provided to the bottom surface 122 of the buried channels 112 as a result of the ion implant 125 (FIG. 3) reduces variation in oxide growth rates between the bottom surface 122 and the sidewall surface 124, thus enabling formation of a more uniform thermal oxide layer 132. Furthermore, in some embodiments, the energy of the of ion implant may be chosen in such a way so all the damaged Si will be consumed during oxidation, thus minimizing leakage from end-of-range damage. As further shown, the gate oxide layer 132 may also be formed atop the fins 120, for example, along the top surface 110 of the substrate.

Although non-limiting, the implantation process may further include heating the substrate 104 to a desired temperature, followed by treatment of the substrate to one or more exposures of ions according to the type of implantation to be performed. The high temperature implantation may be performed, for example, using conventional implantation apparatus, including beam line implanters, or plasma doping (PLAD) apparatus. In some embodiments, the substrate temperature range for performing high temperature implantation may be 50° C. or greater, and in particular, 50° C.-900° C. Moreover, the present embodiments cover implantation of any of elements belonging to Group III, IV, or V of the Periodic Table, as well as inert gas species, halogens, and group VI elements.

In some embodiments, the oxide layer 130 of FIG. 4 may be an oxidation enhancing layer, a first oxidation layer, or a local oxidation of silicon (LOCOS) layer, and the gate oxide layer 132 may be formed after formation of the LOCOS layer. Together, the LOCOS layer and the gate oxide layer 132 atop the LOCOS layer along the bottom surface 122 of the buried channels 112 may be a same or similar thickness as the gate oxide layer 132 along the sidewall surfaces 124 of the buried channels 112.

Figure 6:
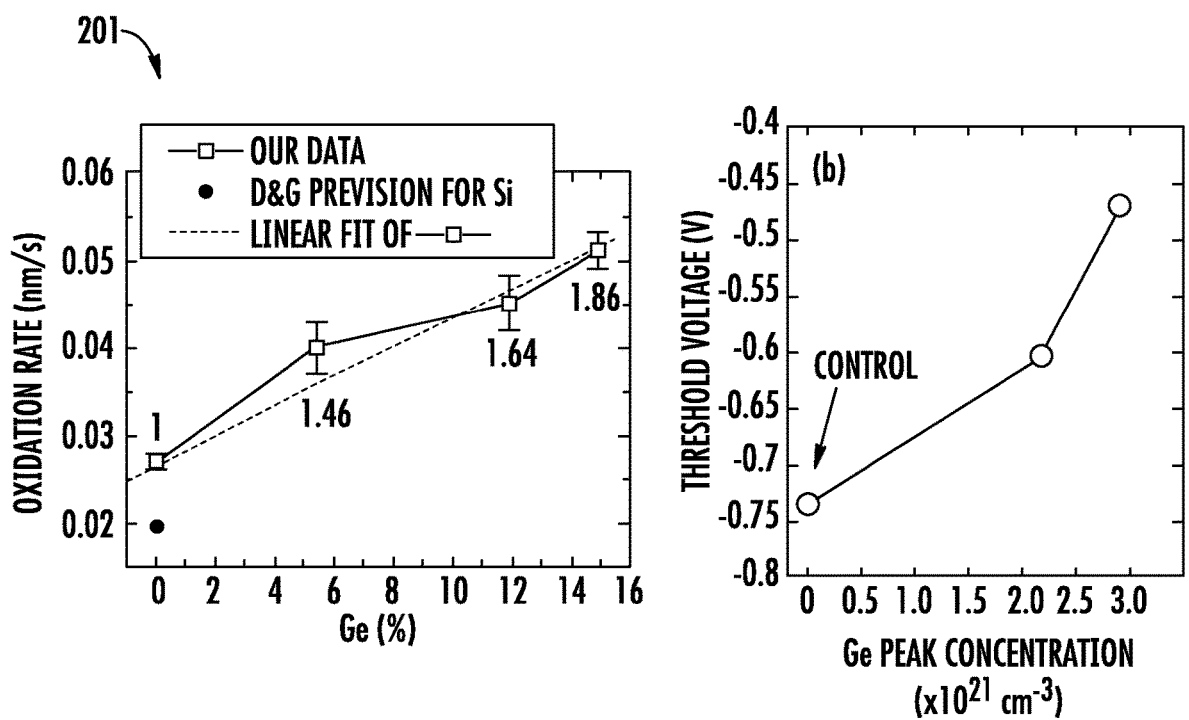
FIG. 6 is a graph illustrating the relationship between Germanium doping concentration in silicon substrates and oxidation rate.
Figure 7:
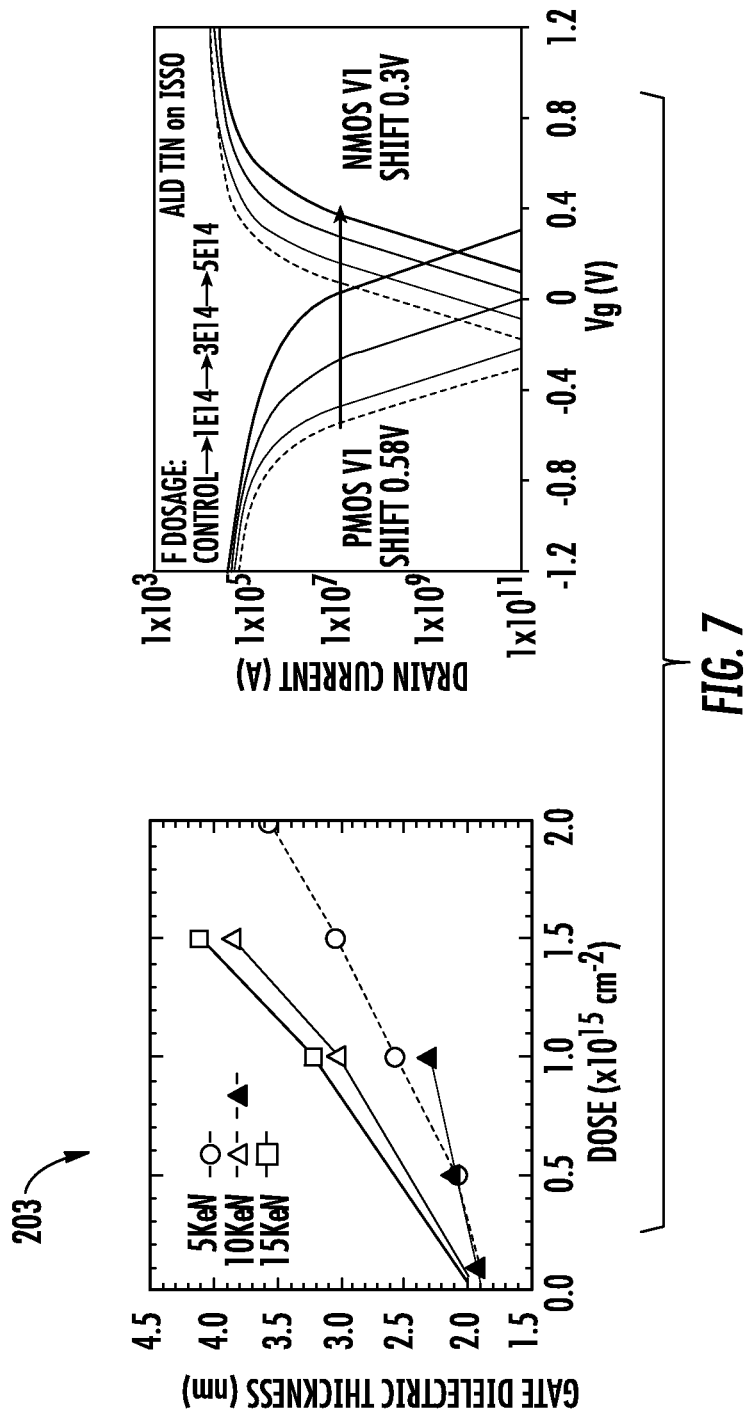
FIG. 7 is a graph illustrating the relationship between Fluorine doping concentration in silicon substrates and oxidation rate.

Referring now to FIGS. 6-7, shown are respective graphs 201 and 203 illustrating oxidation rates for various ion species. In FIG. 6, graph 201 illustrates the relationship of Ge concentration in Si and oxidation rate. As such, by doping the bottom surface of the buried channels with Ge, oxidation of the Si of the substrate along the bottom surface of the buried channels during formation of the gate oxide layer may be increased. Furthermore, Ge in silicon increases NMOS Vt, thus improving retention due to lower leakage. In FIG. 7, graph 203 demonstrates the relationship between increased F concentration (HC) in Si and oxidation rate. As such, by doping the bottom surface of the buried channels with F, oxidation of the Si of the substrate along the bottom surface of the buried channels during formation of the gate oxide layer may be increased. Furthermore, F in silicon/SiO2 interface increases NMOS Vt, thus improving retention due to lower leakage.

Figure 8:
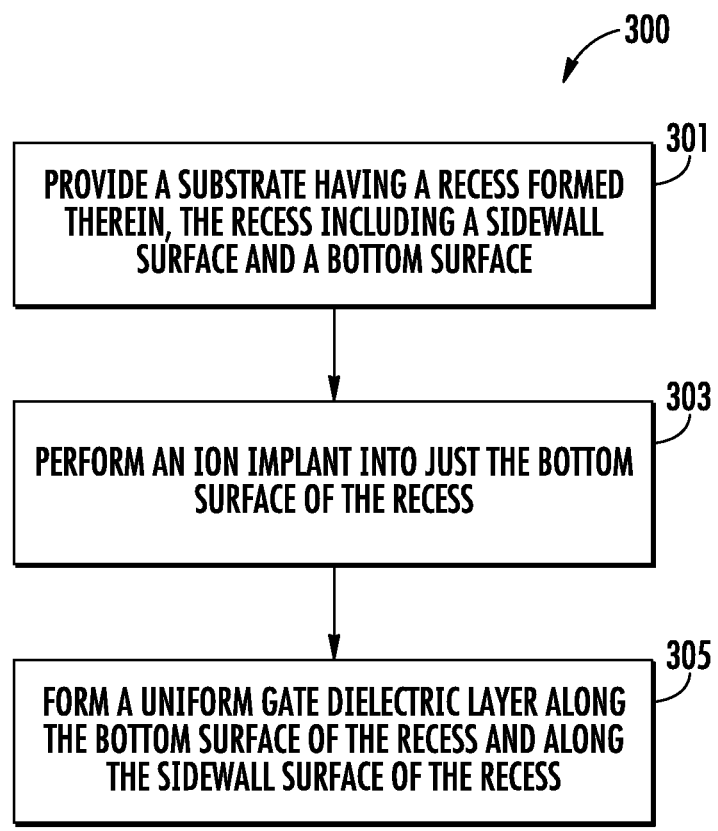
FIG. 8 is a flowchart illustrating an exemplary method according to the present disclosure.

Referring now to FIG. 8, a flow diagram illustrating an exemplary method 300 for patterning a semiconductor device in accordance with the present disclosure is shown. The method 300 will be described in conjunction with the representations shown in FIGS. 1-7. At block 301, the method 300 may include providing a substrate having a recess formed therein, the recess including a sidewall surface and a bottom surface. In some embodiments, the recess is a trench or buried channel of a DRAM device.

At block 303, the method 300 may include performing an ion implant into just the bottom surface of the recess. In some embodiments, the ion implant does not impact the sidewall surface of the recess. In some embodiments, the ion implant is oriented perpendicular, or approximately perpendicular, to a top surface of the substrate. In some embodiments, the ion implant is performed as a series of ion implants with different ion implantation energies and/or ion doses. In some embodiments, an ion species of the ion implant may be at least one of: germanium, fluorine, and oxygen. In some embodiments, the ion implant forms an oxide layer, such as oxidation enhancing layer, a first oxidation layer, or a local oxidation of silicon (LOCOS) layer.

At block 305, the method 300 may include forming a gate dielectric layer along the bottom surface of the recess and along the sidewall surface of the recess. A thickness of the gate dielectric layer along the sidewall surface is approximately the same as a thickness of the gate dielectric layer along the bottom surface of the recess. In some embodiments, the gate dielectric layer is also formed atop a top surface of the substrate. In some embodiments, the gate dielectric layer is thermally grown within the recess.

In view of the foregoing, at least the following advantages are achieved by the embodiments disclosed herein. A first advantage includes a vertical ion implant directed to a bottom surface of recess or buried channel between fins to enhance local growth of a gate oxide layer. By reducing sidewall oxide thickness, on current can be increased through increasing electrical field, and off-current can be reduced through better short channel control. GIDL can also be possible improved by reducing drain voltage since high drain voltage is not necessary anymore due to better driving capability. A second advantage includes performing the ion implant without the presence of a hardmask atop the substrate, therefore simplifying device manufacturing and lowering cost. A third advantage includes increases NMOS Vt as a result of the ion doping, leading to improved retention due to lower leakage.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a dynamic random-access memory device (DRAM) device, the method comprising:
   providing a substrate having a recess formed therein, the recess including a sidewall surface and a bottom surface;
   performing an ion implant into just the bottom surface of the recess to form an oxide layer on the bottom surface; and
   forming a gate dielectric layer over the oxide layer along the bottom surface of the recess and along the sidewall surface of the recess, wherein a thickness of the gate dielectric layer along the sidewall surface is approximately the same as a thickness of the oxide layer combined with the gate dielectric layer along the bottom surface of the recess.

2. The method of claim 1, further comprising:
   patterning a mask layer over substrate; and
   etching the substrate remaining exposed by an opening of the mask layer to form the recess.

3. The method of claim 2, further comprising removing the mask layer from atop the substrate, wherein the ion implant is performed after the mask layer is removed.

4. The method of claim 1, wherein the gate dielectric layer is an oxide layer thermally grown within the recess.

5. The method of claim 1, wherein an ion species of the ion implant is at least one of: germanium, fluorine, and oxygen.

6. The method of claim 1, further comprising performing the ion implant into a top surface of the substrate.

7. The method of claim 6, further comprising performing the ion implant at an angle approximately perpendicular to the top surface of the substrate.

8. The method of claim 1, wherein the ion implant does not impact the sidewall surface of the recess.

9. A method of forming a buried word line transistor of a dynamic random-access memory device, the method comprising:
   forming a plurality of buried channels recessed below a top surface of a substrate, each of the plurality of buried channels including a sidewall surface and a bottom surface;
   forming an oxide layer on the bottom surface of each of the plurality of buried channels by performing an ion implant into just the bottom surface of each of the plurality of buried channels; and
   forming a gate dielectric layer over the oxide layer along the bottom surface and along the sidewall surface of each of the plurality of buried channels after the ion implant is performed, wherein a thickness of the gate dielectric layer along the sidewall surface of each of the plurality of buried channels is approximately the same as a thickness of the oxide layer combined with the gate dielectric layer along the bottom surface of the recess.

10. The method of claim 9, further comprising:
    patterning a mask layer over substrate; and
    etching the substrate remaining exposed by the mask layer to form each of the plurality of buried channels.

11. The method of claim 10, further comprising removing the mask layer from atop the substrate, wherein the ion implant is performed after the mask layer is removed.

12. The method of claim 9, wherein the gate dielectric layer is an oxide layer thermally grown along the top surface of the substrate and within each of the plurality of buried channels.

13. The method of claim 9, wherein a species of the ion implant is at least one of: germanium, fluorine, and oxygen.

14. The method of claim 9, wherein the ion implant further impacts the top surface of the substrate.

15. The method of claim 14, further comprising performing the ion implant at an angle approximately perpendicular to the top surface of the substrate.

16. The method of claim 9, wherein the ion implant does not impact the sidewall surface of each of the plurality of buried channels.

17. A method of forming a uniform gate oxide layer of a dynamic random-access memory (DRAM) device, the method comprising:
    etching a plurality of buried channels in a substrate, each of the plurality of buried channels including a sidewall surface and a bottom surface;
    performing an ion implant into just the bottom surface of each of the plurality of buried channel to form an oxide layer on the bottom surface; and
    forming a gate dielectric layer over the oxide layer along the bottom surface and along the sidewall surface of each of the plurality of buried channels after the ion implant is performed, wherein a thickness of the gate dielectric layer along the sidewall surface of each of the plurality of buried channels is approximately the same as a thickness of the oxide layer combined with the gate dielectric layer along the bottom surface of the recess.

18. The method of claim 17, further comprising:
    patterning a mask layer over substrate; and
    etching the substrate remaining exposed by the mask layer to form each of the plurality of buried channels.

19. The method of claim 18, further comprising removing the mask layer from atop the substrate, wherein the ion implant is performed after the mask layer is removed, and wherein the ion implant forms the oxide layer along just the bottom surface of each of the plurality of buried channels.

20. The method of claim 17, further comprising thermally growing the gate oxide layer over all exposed surfaces of the substrate including within each of the plurality of buried channels.

* * * * *